United States Patent
Hong-Chi (10) Patent No.: US 8,094,455 B2
(45) Date of Patent: Jan. 10, 2012

(54) HIGH-DENSITY INTEGRATED CIRCUIT MODULE STRUCTURE

(75) Inventor: Yu Hong-Chi, Kaohsiung (TW)

(73) Assignee: Walton Advanced Engineering Inc., Taiwan (TW)

( * ) Notice: Subject to any disclaimer, the term of this patent is extended or adjusted under 35 U.S.C. 154(b) by 136 days.

(21) Appl. No.: 12/662,242

(22) Filed: Apr. 7, 2010

(65) Prior Publication Data

US 2011/0211314 A1    Sep. 1, 2011

(30) Foreign Application Priority Data

Feb. 26, 2010    (TW) ................................ 99105589 A (51) Int. Cl.
*H05K 7/20*    (2006.01)
(52) U.S. Cl. ........ 361/721; 361/704; 361/719; 361/720; 361/790; 174/16.1; 257/712; 257/721
(58) Field of Classification Search .................. None
See application file for complete search history.

(56) References Cited

U.S. PATENT DOCUMENTS

| | | | | |
|---|---|---|---|---|
| 5,650,914 | A * | 7/1997 | DiStefano et al. | 361/704 |
| 7,061,774 | B2 * | 6/2006 | Zhang | 361/818 |
| 7,427,809 | B2 * | 9/2008 | Salmon | 257/773 |
| 7,561,436 | B2 * | 7/2009 | Brandenburg et al. | 361/760 |
| 7,663,883 | B2 * | 2/2010 | Shirakami et al. | 361/700 |
| 7,903,408 | B1 * | 3/2011 | Yu | 361/695 |

* cited by examiner

*Primary Examiner* — Boris Chervinsky (74) *Attorney, Agent, or Firm* — Bacon & Thomas, PLLC (57) ABSTRACT

A high-density integrated circuit module structure comprises a substrate and a heat sink at least wherein the substrates form a reversely-staggered contacting stack structure by electrically contacting heat sinks and heat conductors on the heat sink have a non-flat structure at least to realize the present invention which extends the product's functions within an electronic product's restricted height and has a better vibration resistance capability, heat dissipation effect, and no steps involving junctions between solder balls and a carrier in an assembling procedure to simply an assembling procedure with improved functions, increased capacity, and reduced manufacturing costs.

10 Claims, 7 Drawing Sheets

HIGH-DENSITY INTEGRATED CIRCUIT MODULE STRUCTURE

BACKGROUND OF THE INVENTION

1. Field of the Invention

The present invention relates to an integrated circuit module structure, especially a high-density integrated circuit module structure.

2. Prior Art Description

Figure 1:
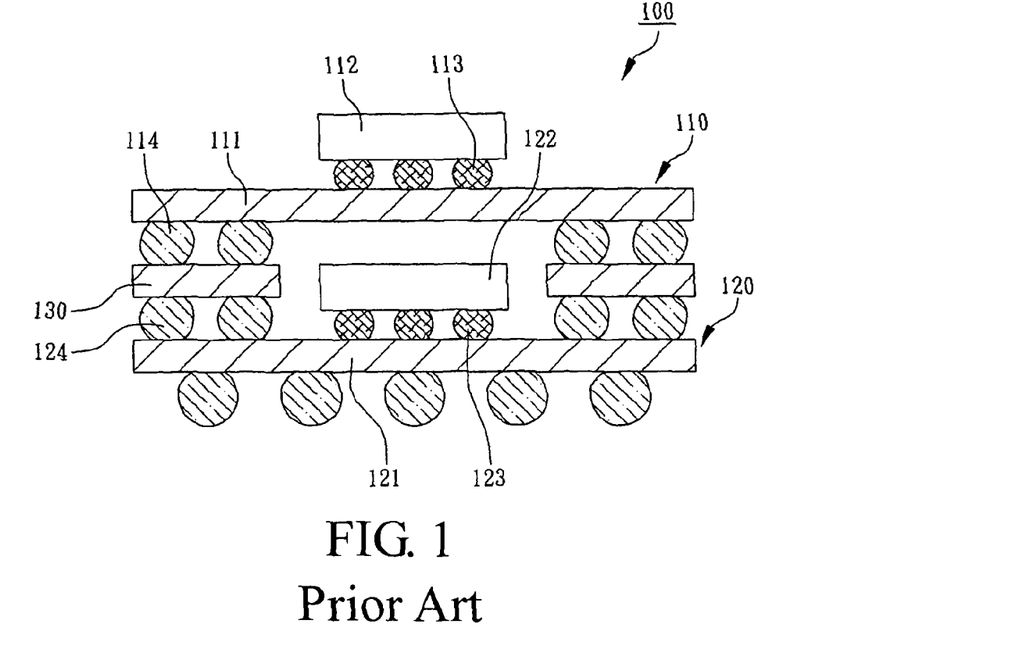
FIG. 1 is a cross-sectional view of a high-density integrated circuit module structure, according to the prior art.

As shown in FIG. 1, a previous integrated circuit module structure (100) comprises a first package (110), a second package (120), and a carrier (130). The first package (110) comprises a first substrate (111), a first chip (112), a plurality of first bumps (113), and a plurality of first solder balls (114). The second package (120) comprises a second substrate (121), a second chip (122), a plurality of second bumps (123), and a plurality of second solder balls (124). The first chip (112) is bonded to the first substrate (111) with the flip-chip first bumps (113); the second chip (122) is bonded to the second substrate (121) with the flip-chip second bumps (123). To improve the product's functions, the first package (110) has to be stacked on and electrically connected to the second package (120) through the carrier (130), the first solder balls (114), and the second solder balls (124). However, in the integrated circuit module structure (100), the first package (110) for the purpose of electrically connecting the second package (120) has to reserve space for accommodating the carrier (130), the first solder balls (114), and the second solder balls (124) which are unfavorable to a shrunk thickness of the integrated circuit module structure (100) and inapplicable to a light, thin, short, and small electronic micro memory product. Additionally, the method to electrically connect the first package (110) and the second package (120) through the carrier (130), the first solder balls (114), and the second solder balls (124) results in a process with steps involving junctions of the first solder balls (114) and the second solder balls (124) without reduced assembling procedures or manufacturing costs consequentially. On the other hand, stress applied to the integrated circuit module structure (100) easily destroys the first solder balls (114) and the second solder balls (124) due to possible vibration and then leads to poor-quality connected signals. Furthermore, a high temperature developing from a first chip (112) and a second chip (122) under operation also gives rise to a problem of bad heat dissipation.

SUMMARY OF THE INVENTION

To solve said problems, the present invention is intended to offer a high-density integrated circuit module structure comprising a substrate and a heat sink at least wherein the substrates which electrically contact the heat sinks form a reversely-staggered contacting stack structure to expand the product's functions within an electronic product's restricted height.

The another purpose of the present invention is to supply a high-density integrated circuit module structure comprising a substrate and a heat sink at least wherein the substrates electrically contact the heat sink to form a reversely-staggered contacting stack structure and heat conductors on the heat sink has a non-flat structure at least, which provides capabilities of stress absorbed, buffer, and better vibration resistance to maintain good-quality connected signals as the present invention is subject to stress.

The next purpose of the present invention is to provide a high-density integrated circuit module structure comprising a substrate and a heat sink at least electrically contacting each other to construct the substrates with a reversely-staggered contacting stack structure wherein heat conductors on the heat sink realizes the invention with a better heat dissipation effect.

The another purpose of the present invention is to supply a high-density integrated circuit module structure which comprises a substrate and a heat sink at least electrically contacting each other to construct the substrates with a reversely-staggered contacting stack structure without steps for junctions between solder balls and a carrier in an assembling procedure but a simplified assembling procedure for improved functions, increased capacity, and reduced manufacturing costs due to no soldering points on bonding planes of the substrates.

To realize said purposes, the primary technical solutions used in the present invention are technical programs shown as follows. The present invention of a high-density integrated circuit module structure comprises a substrate and a heat sink at least wherein the substrate has an inner surface and an outer surface which possesses a plurality of outer pads and a plurality of adapter pads, the outer pads electrically connect the adapter pads, and the substrate's inner surface is equipped with an electronic device at least electrically connecting the outer pads and the adapter pads; a heat sink at least comprises a plurality of heat conductors wherein the heat sink is installed on end planes of adapter pads on the substrate and the heat conductors contacting the adapter pads have a non-flat structure at least; a substrate has the outer pads electrically contacting the adapter pads on another substrate by the heat conductors to express the integrated circuit module with a reversely-staggered contacting high-density stack structure.

The purposes and solved technical problems of the present invention can be further realized by the following technical solutions.

A high-density integrated circuit module structure mentioned previously has a substrate with the outer pads electrically contacting the adapter pads on another substrate by the heat conductors' non-flat structure.

A high-density integrated circuit module structure mentioned previously has the non-flat structure which comprises one of the following shapes at least or a combination of those shapes such as a single bulge, a plurality of square-toothed profiles, a plurality of arch profiles, a plurality of round-toothed profiles, and a plurality of salient points.

A high-density integrated circuit module structure mentioned previously has the outer pads comprising metal contact points which are compatible to one of the following data communication interfaces at least such as Universal Serial Bus (USB), Mini Universal Serial Bus (Mini USB), Micro Universal Serial Bus (Micro USB), or Serial Advanced Technology Attachment (e-SATA).

The present invention also incorporates another technical solution. A high-density integrated circuit module structure comprises a substrate, a heat sink, and an extended substrate at least wherein the substrate has an inner surface with a first port as well as an electronic device at least and an outer surface with a plurality of outer pads and a plurality of adapter pads electrically connecting each other for electrical connection of the first port and the electronic device; a heat sink at least comprising a plurality of heat conductors is installed on end planes of adapter pads on the substrate and the heat conductors contacting the adapter pads have a non-flat structure at least; an extended substrate at least has an inner surface comprising a second port and an electronic device at least which electrically connects the extended substrate; the outer pads of a substrate electrically contact the adapter pads of another substrate by the heat conductors and the second port of the extended substrate mutually couples with the first port of the substrate for transmitting signals of the electrically-connected integrated circuit module.

A high-density integrated circuit module structure mentioned previously has the electronic device on the extended substrates comprising a control chip and a memory wherein the control chip receives signals transmitted by the substrate through the second port which mutually couples with the first port of the substrate.

A high-density integrated circuit module structure mentioned previously has the electronic device on the substrates comprising a control chip and a memory wherein the control chip receives signals transmitted by the extended substrate through the first port which mutually couples with the second port of the extended substrate.

A high-density integrated circuit module structure mentioned previously has a substrate with the outer pads electrically contacting another substrate's adapter pads by the heat conductors' non-flat structure.

A high-density integrated circuit module structure mentioned previously has the non-flat structure which comprises one of the following shapes at least or a combination of those shapes such as a single bulge, a plurality of square-toothed profiles, a plurality of arch profiles, a plurality of round-toothed profiles, and a plurality of salient points.

A high-density integrated circuit module structure mentioned previously has the outer pads comprising metal contacts which are compatible to one of the following data communication interfaces at least such as Universal Serial Bus (USB), Mini Universal Serial Bus (Mini USB), Micro Universal Serial Bus (Micro USB), or Serial Advanced Technology Attachment (e-SATA).

In contrast to the prior art, the present invention with effects to realize the substrates electrically contacting the heat sink, the substrates with a reversely-staggered contacting stack structure, and a non-flat structure of heat conductors on the heat sink possesses: (1) Extended functions of the product within an electronic product's restricted height; (2) Capabilities such as stress absorbed, buffer, and better vibration resistance to maintain good-quality connected signals supplied by the non-flat structure for the case of an integrated circuit module structure under stress; (3) Better heat dissipation effect of the substrates due to heat conductors on a heat sink; (4) A simplified assembling procedure for improved functions, increased capacity, and reduced manufacturing costs due to no soldering points on bonding planes of the substrates and no steps correlated with junctions between solder balls and a carrier in an assembling procedure consequentially.

BRIEF DESCRIPTION OF THE DRAWINGS

FIG. 4-1 is a cross-sectional view of a heat sink's heat conductor which contacts an outer pad, according to the present invention.

FIG. 4-2 is a cross-sectional view of a heat sink's heat conductor which contacts an adapter pad, according to the present invention.

FIG. 9-1 is a three-dimensional view of a plurality of salient points on a non-flat structure, according to the present invention.

FIG. 9-2 is a cross-sectional view along A-A in FIG. 9-1, according to the present invention.

DETAILED DESCRIPTION OF THE PREFERRED EMBODIMENT

Figure 2:
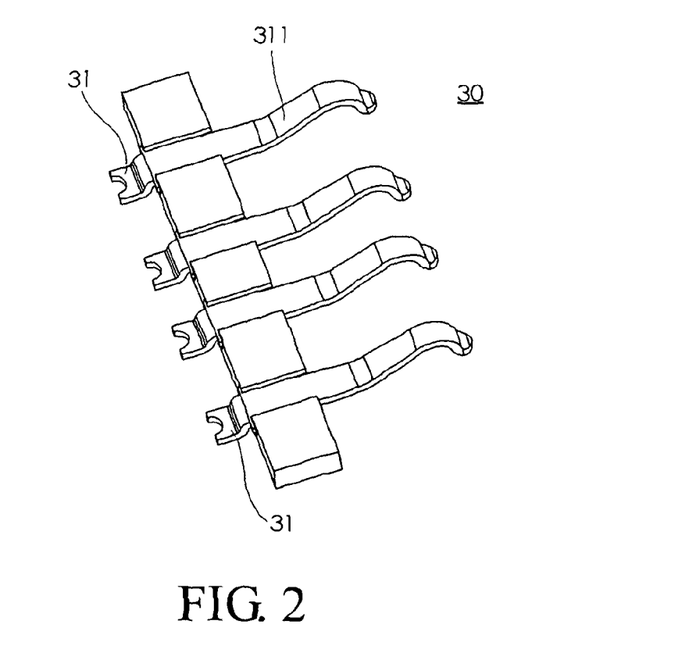
FIG. 2 is a three-dimensional view of a heat sink, according to the present invention.
Figure 3:
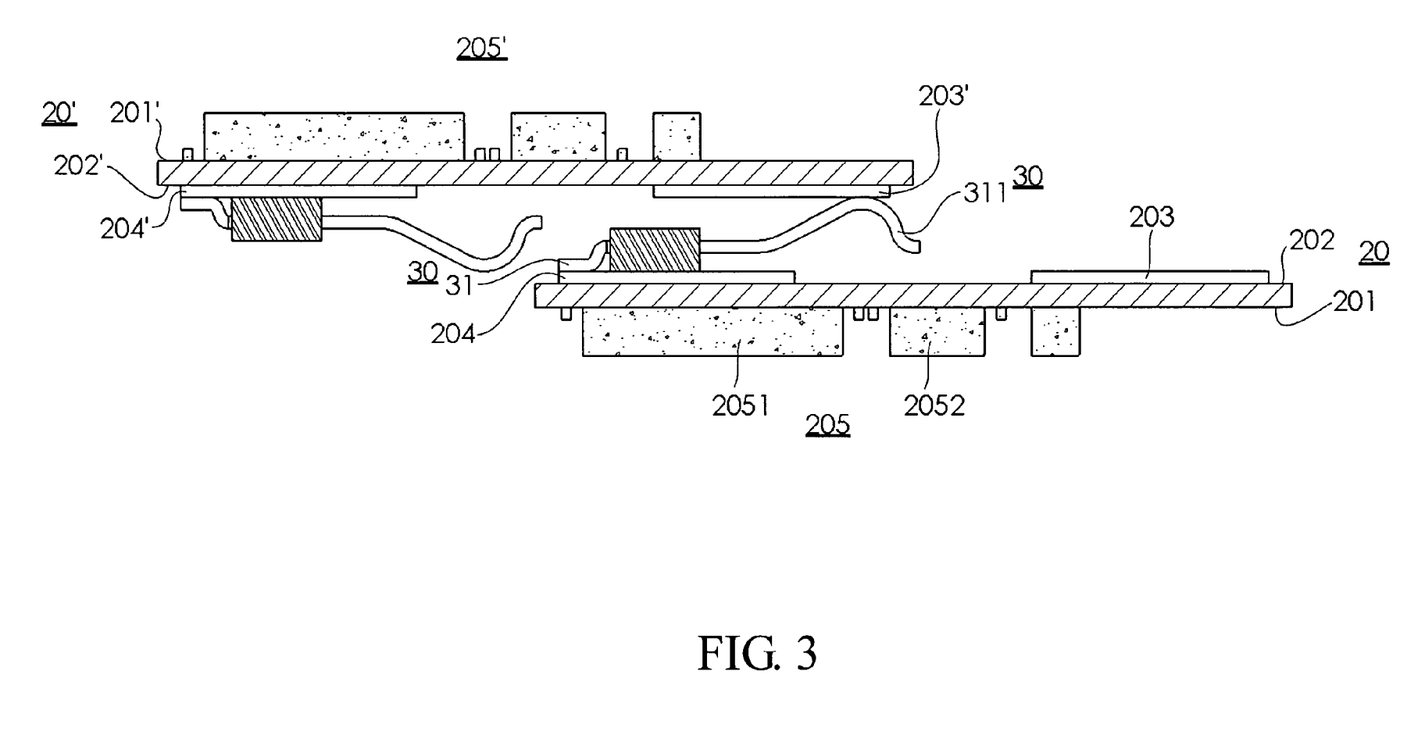
FIG. 3 is a cross-sectional view of a high-density integrated circuit module structure, according to the present invention.
Figure 5:
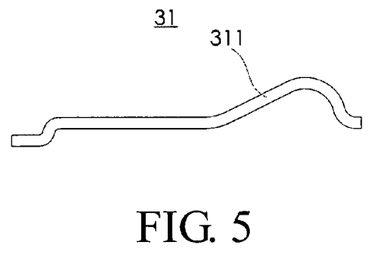
FIG. 5 is a cross-sectional view of a single bulge on a non-flat structure, according to the present invention.
Figure 6:
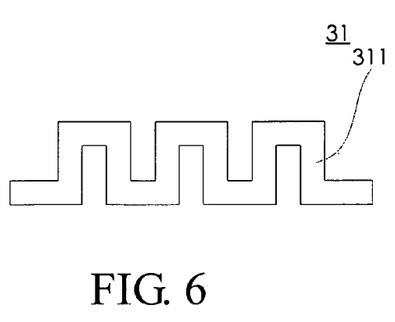
FIG. 6 is a cross-sectional view of a plurality of square-toothed profiles on a non-flat structure, according to the present invention.
Figure 7:
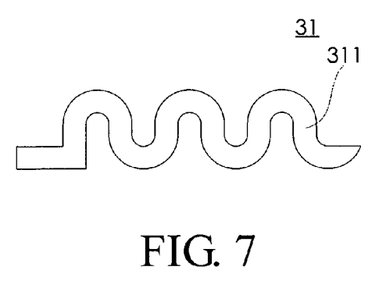
FIG. 7 is a cross-sectional view of a plurality of arch profiles on a non-flat structure, according to the present invention.
Figure 8:
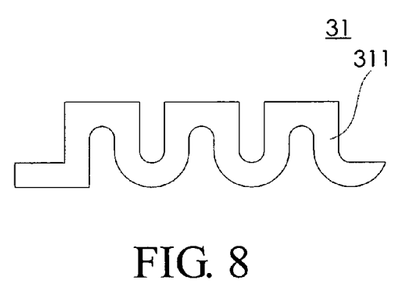
FIG. 8 is a cross-sectional view of a plurality of round-toothed profiles on a non-flat structure, according to the present invention.
Figure 10:
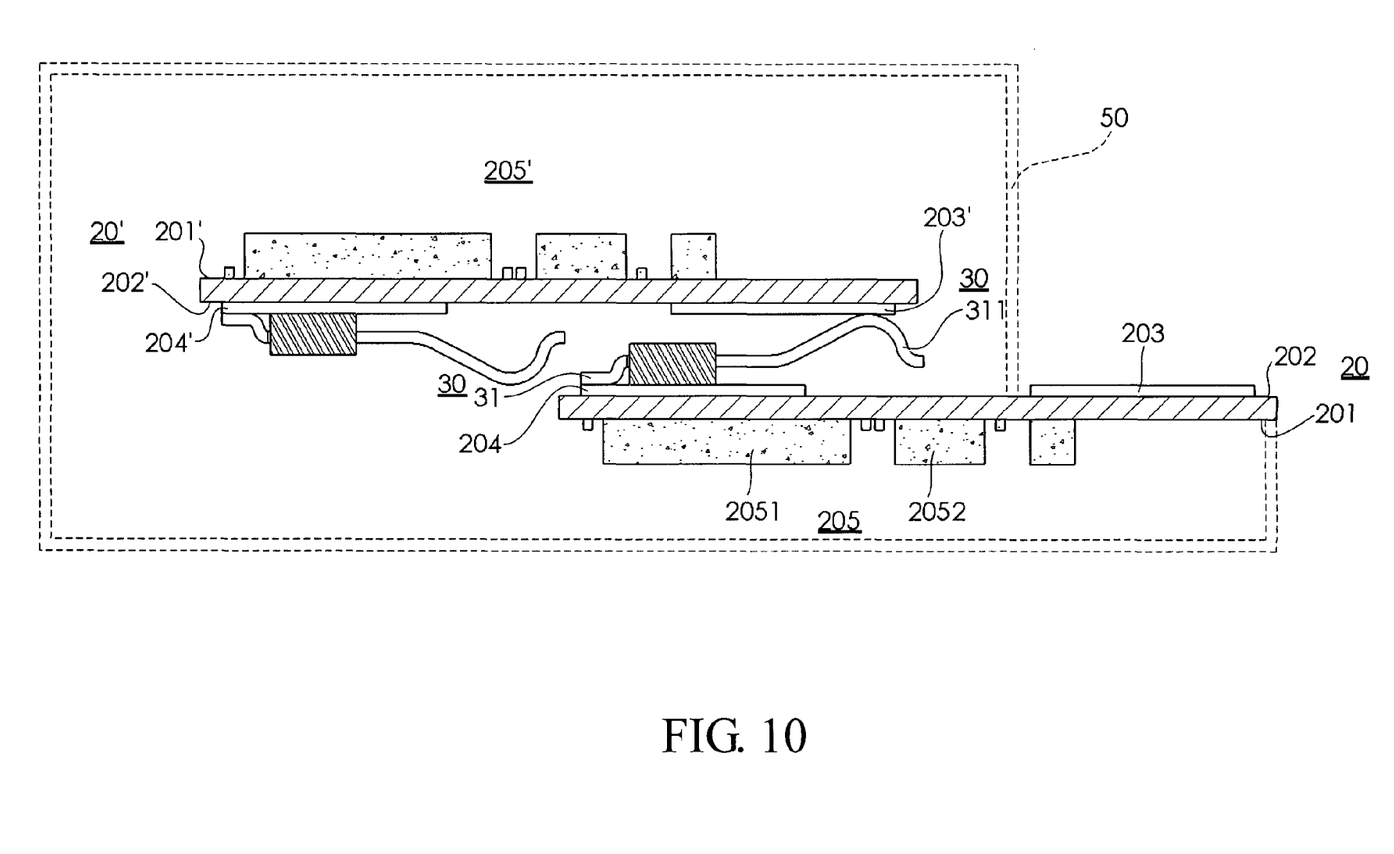
FIG. 10 is a cross-sectional view of a high-density integrated circuit module structure with a case included, according to the present invention.

To clearly interpret purposes, properties, and effects of the present invention, the preferred embodiments of the invention are listed as follows:

Refer to FIG. 2 and FIG. 3, which show a high-density integrated circuit module structure mainly comprising a substrate (20) and a heat sink (30) at least. Taken as a chip carrier as well as a communication interface, the substrate (20) with an inner surface (201) and an outer surface (202) can be a high-density dual-conductive multi-layer printed circuit board with circuits developed inside (not shown in the drawings). In this regard, the outer surface (202) possesses a plurality of outer pads (203) and a plurality of adapter pads (204) wherein the mentioned outer pads (203) and the adapter pads (204) are reversely symmetrical and the outer pads (203) electrically connect to the adapter pads (204) by circuits on the substrate (20) (no shown in the drawings). The outer pads (203) and the adapter pads (204) can be metal contact points wherein the metal contact points of the outer pads (203) are compatible to one of the following data communication interfaces at least such as Universal Serial Bus (USB), Mini Universal Serial Bus (Mini USB), Micro Universal Serial Bus (Micro USB), or Serial Advanced Technology Attachment (e-SATA). In addition, the inner surfaces (201) of the substrates (20) are equipped with an electronic device (205) at least electrically connecting to the outer pads (203) and the adapter pads (204) by bonding wires or a flip chip technique to electrically link the electronic device (205) and the substrates (20). In general, the electronic device (205) comprises a control chip (2051) and a memory (2052) which can be a FLASH memory, a Static-Random-Access-Memory (SRAM), an Application-Specific-Integrated-Circuit (ASIC), a memory chip or a Synchronous-Dynamic-Random-Access-Memory (SDRAM). In this embodiment, the control chip (2051) electrically connects to the memory (2052), the outer pads (203) and the adapter pads (204), controls storage and access of the memory (2052), and monitors the adapter pads (204) connecting to another substrate (20') and transmitting control signals to the substrate (20'). Furthermore, the heat sink (30) comprising a plurality of heat conductors (31) is installed on end planes of the adapter pads (204) on the substrate (20) wherein heat conductors (31) contact the adapter pads (204) and has a non-flat structure (311) at least. Thus, outer pads (203) on a substrate (20) electrically contacting adapter pads (204') on another substrate (20') by heat conductors (31) construct the integrated circuit module with a reversely-staggered contacting high-density stack structure. In a preferred embodiment, the outer pads (203) on a substrate (20) electrically contacting adapter pads (204') on another substrate (20') by a non-flat structure of heat conductors (31) extend the product's functions due to the present invention with more substrates horizontally linked within a product's restricted height and develop a better vibration resistance capability in the present invention to maintain good-quality connected signals by the non-flat structure installed. In a preferred embodiment, the shape of the non-flat structure (311) comprises a single bulge (as shown in FIG. 5), a plurality of square-toothed profiles (as shown in FIG. 6), a plurality of arch profiles (as shown in FIG. 7), a plurality of round-toothed profiles (as shown in FIG. 8), a plurality of salient points (as shown in FIG. 9-1 and FIG. 9-2), a random combination of a single shape and a plurality of shapes mentioned previously, or a combination of another single shape and a plurality of shapes unlisted here. In addition, there is a method of bonding the heat sink (30) to one side of the substrate (20) in the vicinity of the outer pads (203) including but not limited to a latch hook (not shown in the drawings), which realizes both the non-flat structure (311) contacting the outer pads (203) (as shown in FIG. 4-1) and the heat sink (30) bonding to one side of the substrate (20) in the vicinity of the adapter pads (204) to make the non-flat structure (311) contacting the adapter pads (204) (as shown in FIG. 4-2) for electrical conduction at plug-in. However, a bonding mechanism is not limited to a latch hook but any method extensively used in the industry such as riveting, mortise joint, fastener, lock, and imbedding. Furthermore, because the steps in an assembling procedure of the prior art such as a carrier (130), first solder balls (114), and second solder balls (124) as shown in FIG. 1 are not required due to no soldering points on bonding planes of the substrates (20, 20'), the simplified assembling procedure improves functions and capacity and reduces manufacturing costs. In a preferred embodiment, the heat conductors (31) on a heat sink of the present invention (30) can be fabricated in copper, aluminum, or any other metals for thermal conduction of heat sources developed from the substrates (20, 20') and better heat dissipation. In addition, the heat sink (30) and the substrate (20) can be linked separately, that is a plug-in type. Furthermore, refer to FIG. 10, the present invention with a case (50) added to accommodate a substrate (20) and a heat sink (30) inside but outer pads (203) on the outer surface (202) of the substrate (20) exposed outside the case (50) to link an external information device, such as a port of one computer's data communication interface, for data communication via metal contact points of the outer pads (203).

Figure 11:
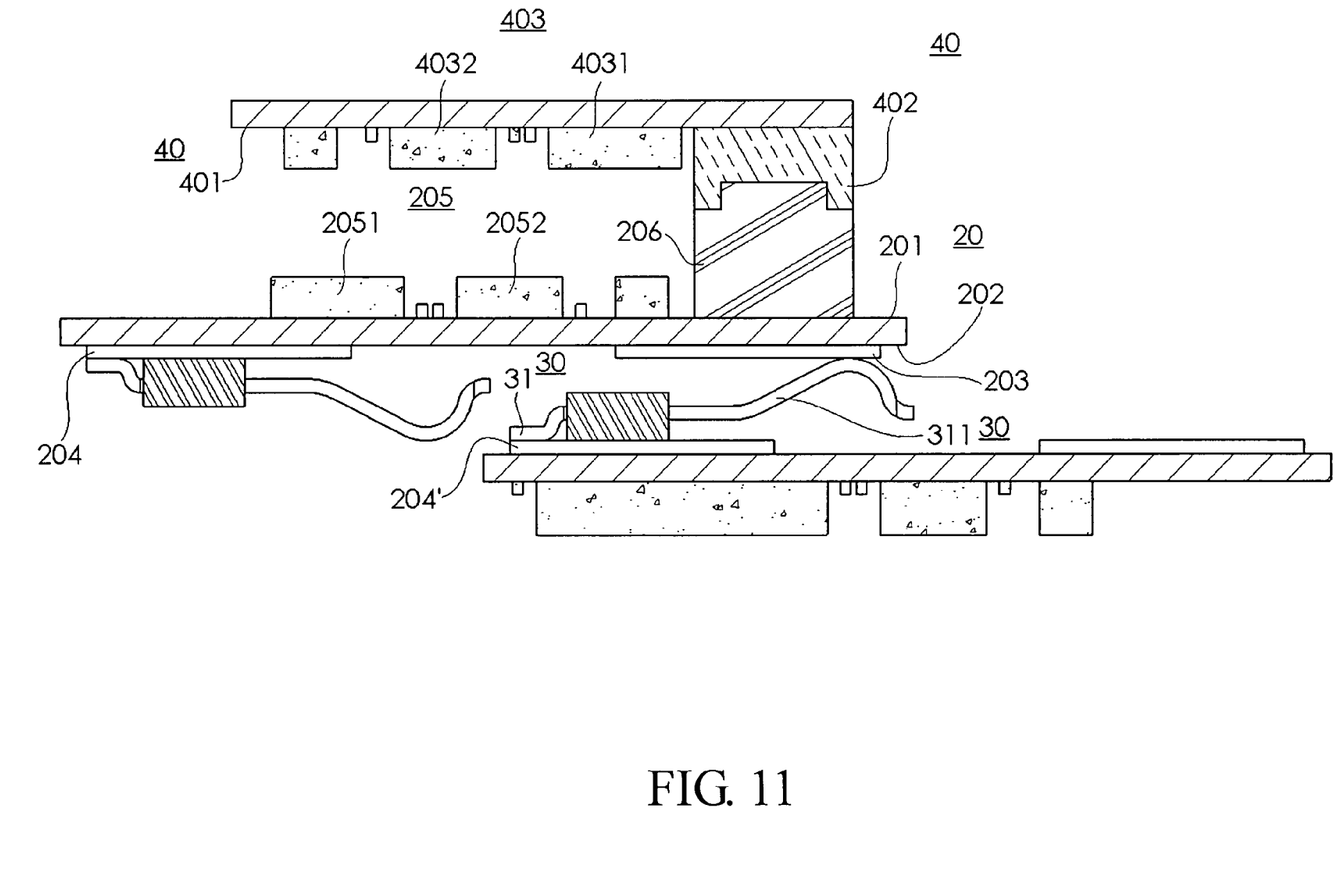
FIG. 11 is a cross-sectional view of a second embodiment, according to the present invention.
Figure 41:
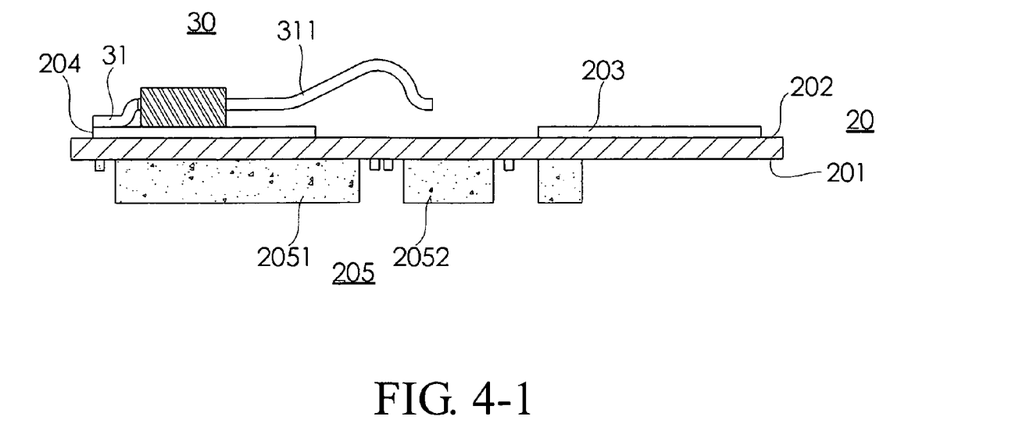
Figure 42:
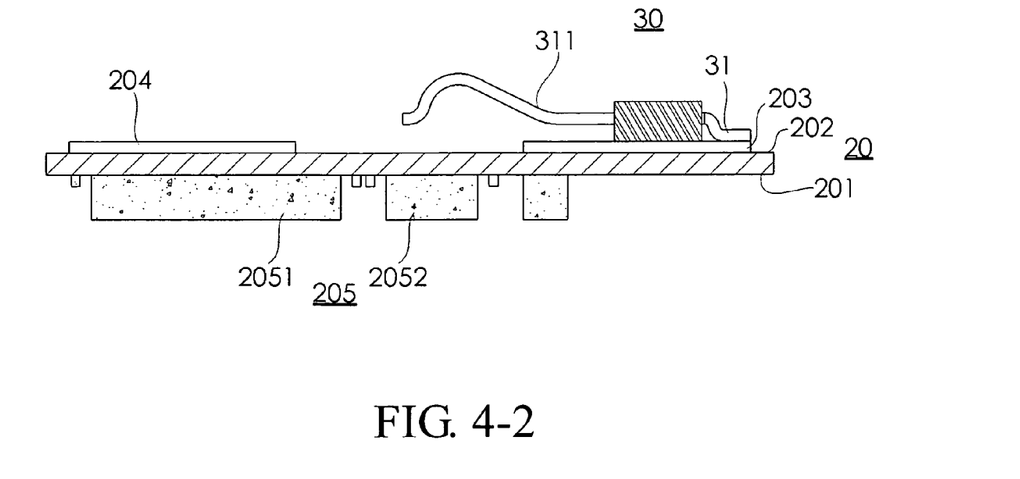
Figure 91:
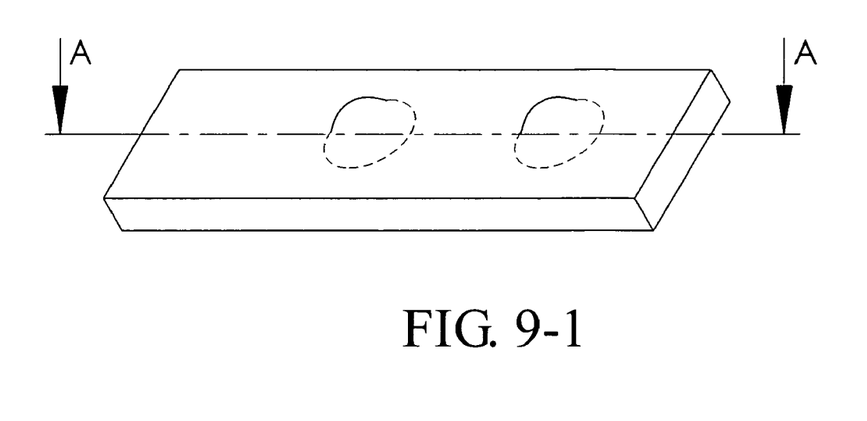
Figure 92:
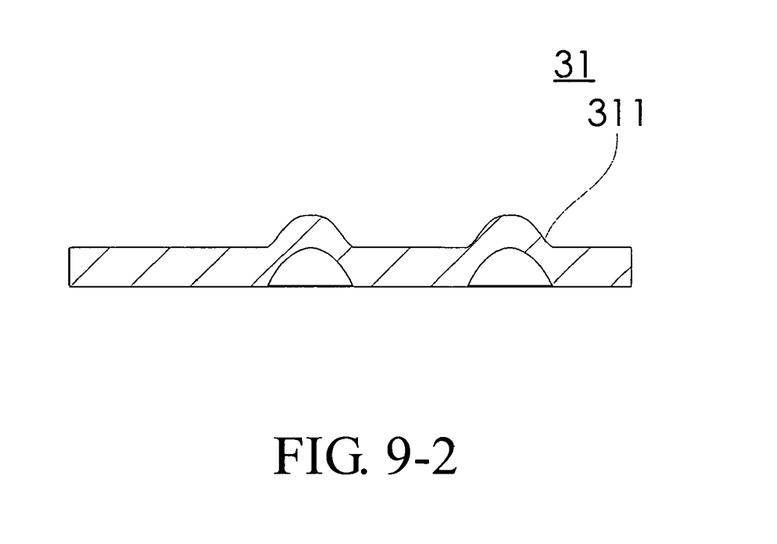

Refer to FIG. 11, a second embodiment of the present invention with a high-density integrated circuit module structure, which is similar to components in a high-density integrated circuit module structure illuminated in the first embodiment and from FIG. 2 to FIG. 10, has identical notations therein neglected to be described.

A difference between the second embodiment and the first embodiment is a high-density integrated circuit module structure wherein the inner surfaces (201) of the substrates (20) are equipped with a first port (206), an electronic device (205) at least, which electrically connects to outer pads (203) and adapter pads (204), and an extended substrate (40) at least with an inner surface (401) comprising a second port (402) and an electronic device (403) at least electrically connecting the extended substrate (40). When outer pads (203) on a substrate (20) electrically contact adapter pads (204') on another substrate (20') by the heat conductors (31) and the second port (402) on the extended substrate (40) mutually couples with the first port (206) on the substrate (20), the integrated circuit module electrically connected can be used to transmit signals. In a preferred embodiment, the first port (206) and the second port (402) can be a male plug and a female socket of one connector respectively for a substrate (20) and an extended substrate (40) securely bonded. An electronic device (403) on an extended substrate (40) comprises a control chip (4031) and a memory (4032) wherein the control chip (4031) receives signals from the substrate (20) via the second port (402) and the first port (206) on the substrate (20) which are mutually coupled; on the other hand, an electronic device (205) on the substrate (20) can comprise a control chip (2051) and a memory (2052), receiving signals from the extended substrate (40) via the first port (206) and the second port (402) on the extended substrate (40) which are mutually coupled. Thus, due to signal transmitted between control chips (2051, 4031) on the substrate (20) and the extended substrate (40), the present invention expands a capacity to store existing data or creates other additional functions.

In summary, because the substrates and the heat sink electrically contacting in the present invention construct the substrates with a reversely-staggered contacting stack structure, add an extended substrate at least which electrically contacts a substrate, and have the heat sink's heat conductors with a non-flat structure at least, the present invention possesses: (1) Extended functions of the product within an electronic product's restricted height; (2) Capabilities such as stress absorbed, buffer, and better vibration resistance to maintain good-quality connected signals supplied by the non-flat structure for the case of an integrated circuit module structure under stress; (3) Better heat dissipation effect of the substrates due to heat conductors on a heat sink; (4) A simplified assembling procedure for improved functions, increased capacity, and reduced manufacturing costs due to no soldering points on bonding planes of the substrates and no steps correlated with junctions between solder balls and a carrier in an assembling procedure consequentially. According, the present invention, which has effects different from those of a general traditional high-density integrated circuit module structure and is substantially originated among similar products, fits in with patentability and we claim herein.

All such descriptions are intended to be the preferred embodiments of the present invention and those equivalent structural changes by applying this invention specification, claims, or drawings are within the scope of the present invention as defined by the claims.

What is claimed is:

1. A high-density integrated circuit module structure, comprising:
    a substrate 20 at least has an inner surface 201 and an outer surface 202 with a plurality of outer pads 203 and a plurality of adapter pads 204 wherein the outer pads 203 electrically connect to the adapter pads 204 and the inner surface 201 of the substrate 20 is equipped with an electronic device 205 at least electrically connecting the outer pads 203 and the adapter pads 204;
    a heat sink 30 at least with a plurality of heat conductors 31 wherein the heat sink 30 is installed on end planes of the adapter pads 204 on the substrate 20 and the heat conductors 31 contact the adapter pads 204 and have a non-flat structure 311 at least;
    the substrate 20 has the outer pads 203 electrically contacting the adapter pads 204' on another substrate 20' by heat conductors 31 to construct the integrated circuit module with a reversely-staggered contacting high-density stack structure.

2. A high-density integrated circuit module structure according to claim 1, wherein the outer pads 203 on a substrate 20 electrically contact the adapter pads 204' on another substrate 20' by a non-flat structure 311 of the heat conductors 31.

3. A high-density integrated circuit module structure according to claim 1, wherein the non-flat structure 311 comprises one of the following shapes at least or a combination of those shapes such as a single bulge, a plurality of square-toothed profiles, a plurality of arch profiles, a plurality of round-toothed profiles, and a plurality of salient points.

4. A high-density integrated circuit module structure according to claim 1, wherein the outer pads 203 are metal contact points compatible to one of the following data communication interfaces at least such as Universal Serial Bus (USB), Mini Universal Serial Bus (Mini USB), Micro Universal Serial Bus (Micro USB), or Serial Advanced Technology Attachment (e-SATA).

5. A high-density integrated circuit module structure, comprising:
- a substrate 20 at least has an inner surface 201 and an outer surface 202 with a plurality of outer pads 203 and a plurality of adapter pads 204 wherein the outer pads 203 electrically connect to the adapter pads 204 and the inner surface 201 of the substrate 20 is equipped with a first port 206 as well as an electronic device 205 at least which electrically connects to the outer pads 203 and the adapter pads 204;
- a heat sink 30 at least with a plurality of heat conductors 31 wherein the heat sink 30 is installed on end planes of the adapter pads 204 on the substrate 20, and the heat conductors 31 contact the adapter pads 204 and have a non-flat structure 311 at least;
- an extended substrate 40 at least has an inner surface 401 comprising a second port 402 and at least one electronic device 403 which electrically connects to the extended substrate 40;

wherein the outer pads 203 of a substrate 20 electrically contact the adapter pads 204' on another substrate 20' by the heat conductors 31 and the second port 402 of the extended substrate 40 mutually couples with the first port 206 of the substrate 20 for signal communication of an electrically connected integrated circuit module.

6. A high-density integrated circuit module structure according to claim 5, wherein the electronic device 403 on the extended substrate 40 comprises a control chip 4031 as well as a memory 4032 and the control chip 4031 receives signals from the substrate 20 via the second port 402 and the first port 206 on the substrate 20 which are mutually coupled.

7. A high-density integrated circuit module structure according to claim 5, wherein an electronic device 205 on the substrate 20 comprises a control chip 2051 as well as a memory 2052 and the control chip 2051 receives signals from the extended substrate 40 via the first port 206 and the second port 402 on the extended substrate 40 which are mutually coupled.

8. A high-density integrated circuit module structure according to claim 5, wherein the outer pads 203 of the substrate 20 electrically contact the adapter pads 204' of another substrate 20' by a non-flat structure 311 of the heat conductors 31.

9. A high-density integrated circuit module structure according to claim 5, wherein the non-flat structure 311 comprises one of the following shapes at least or a combination of those shapes such as a single bulge, a plurality of square-toothed profiles, a plurality of arch profiles, a plurality of round-toothed profiles, and a plurality of salient points.

10. A high-density integrated circuit module structure according to claim 5, wherein the outer pads 203 are metal contact points compatible to one of the following data communication interfaces at least such as Universal Serial Bus (USB), Mini Universal Serial Bus (Mini USB), Micro Universal Serial Bus (Micro USB), or Serial Advanced Technology Attachment (e-SATA).

\* \* \* \* \*